(12) United States Patent
Yamashita

(10) Patent No.: US 6,236,129 B1
(45) Date of Patent: May 22, 2001

(54) MOTOR WITH HYDRODYNAMIC BEARING AND HEAT SINK DEVICE EMPLOYING THIS MOTOR

(75) Inventor: Akitomo Yamashita, Usa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/387,557

(22) Filed: Sep. 1, 1999

(30) Foreign Application Priority Data

Sep. 1, 1998 (JP) .................................................. 10-246778

(51) Int. Cl.[7] ...................................................... F16C 17/02
(52) U.S. Cl. ................................................ 310/90; 384/107
(58) Field of Search .................................... 310/90, 67 R, 310/64; 384/276, 283, 100, 107, 114, 120; 361/695, 697

(56) References Cited

U.S. PATENT DOCUMENTS 5,647,672 * 7/1997 Fukutani ............................. 384/100
5,715,116 * 2/1998 Moritan et al. .................... 360/99.08
6,084,328 * 7/2000 Yamashita et al. ..................... 310/90

FOREIGN PATENT DOCUMENTS 63-58283  1/1982  (JP) .
7-1528    7/1990  (JP) .

* cited by examiner

Primary Examiner—Karl Tamai
(74) Attorney, Agent, or Firm—Wenderoth, Lind & Ponack, L.L.P.

(57) ABSTRACT

A long service-life motor free from oil-spill from its bearing is achieved by a construction including (a) a frame having an opening, (b) a housing disposed on the frame and having one side thereof open, (c) a stator secured to the housing, (d) a sleeve situated in the housing and having an inner wall being machined straight in its axial direction, (e) a rotary shaft extending through the sleeve and being rotatably supported by the sleeve, (f) a groove formed on part of the inner wall of the sleeve, facing the rotary shaft and retaining oil, (g) a ventilating path formed on at least one of an inner wall of the housing or an outer wall of the sleeve, (h) an annular recess formed on the outer wall of the sleeve and communicating to the ventilating path, (i) a rotor having a magnet opposite to the stator, and (j) oil lubricated in a space between the shaft and the sleeve, the groove retaining oil, the annular recess as well as another space formed by the bottom face of the housing and the sleeve. This construction allows the bearing to be downsized and also machined with ease. A heat sink device employing this motor is able to be smaller in size and to operate more efficiently at a lower noise level.

23 Claims, 6 Drawing Sheets

MOTOR WITH HYDRODYNAMIC BEARING AND HEAT SINK DEVICE EMPLOYING THIS MOTOR

FIELD OF THE INVENTION

The present invention generally relates to a motor having a hydrodynamic bearing, and further relates to a heat sink device using this motor for efficiently cooling, e.g. semiconductor devices.

BACKGROUND OF THE INVENTION

FIG. 4 is a cross section depicting a structure of a conventional heat sink device employing a motor having a hydrodynamic bearing. FIG. 5 is a cross section of a motor-bearing employed in the heat sink device of FIG. 4.

A structure of the prior art is described hereinafter with reference to FIG. 4 and FIG. 5.

Housing 151 having one open side and being cup shaped is protrusively formed on a recess of frame 101. Housing 151 secures stator 103 on its outer wall, and stator 103 is wound with coil 102. Driving circuit substrate 104 is disposed around housing 151. Substrate 104 holds stator 103 and connects electrically a terminal of coil 102 to printed wiring formed on substrate 104 by soldering. Substrate 104 is equipped with electronic components constituting the driving circuit and Hall elements. Insulating sheet 107 is disposed between substrate 104 and frame 101.

Frame 101 is surrounded by a side wall and has an upward opening. Bell-mouth 119 is disposed around the opening to promote airflow. Thruster 105 made of resin is disposed on a bottom face of housing 151. Sleeve 106, is fit into housing 151. Stator unit 115 comprises these elements discussed above, i.e. frame 101, housing 151, sleeve 106, coil 102 and stator 103.

Rotary shaft 109 extends through sleeve 106, and is axially supported by thruster 105 as well as journaled by sleeve 106. Fan 108 is mounted to shaft 109. Magnet 111 is bonded to fan 108 via magnet yoke 112 so that magnet 111 faces stator 103. Rotor 116 comprises the elements discussed above, i.e. magnet 111, yoke 112 and fan 108.

The bearing of the motor is detailed hereinafter with reference to FIG. 5.

In FIG. 5, sleeve 106 is equipped with oil reservoir 155 near the center of its inner wall. Oil reservoir 155 has a greater inner diameter than other parts of the inner wall of sleeve 106. Sleeve 106 has dynamic-pressure-generating-grooves 113 on both sides of oil reservoir 155. Grooves 113 are formed by a ball-rolling-process, which eventually accompanies burrs on inner wall of sleeve 106. Thus sizing is further provided to remove the burrs so that an error of the inner diameter of the sleeve is kept to as little as not more than ±2 μm. Oil 114 is provided as lubricant to grooves 113 for sleeve 106 and shaft 109. Radial bearing 117 is thus formed as discussed above.

The tip of shaft 109 facing thruster 105 is machined into a spherical face that contacts thruster 105 so that thruster 105 supports shaft 109 axially. Thrust bearing 118 is thus structured as discussed above.

The conventional motor employing this hydrodynamic bearing, however, has the following problems.

Electronic apparatuses including personal computers and electric home appliances have been downsized in recent years, which entails requiring the cooling fan—one of the components of the apparatuses and appliances—to be smaller and slimmer. In order to meet this requirement, the bearing space is narrowed, which forces the outer diameter of rotary shaft 109 and inner diameter of sleeve 106 to be narrowed.

In the prior art, since a bite shank having ca. 2 mm diameter has been used in machining the bearing, oil reservoir 155 can be machined with regard to sleeve 106 having not less than 3 mm inner diameter. However, when sleeve 106 is downsized to have not more than 2 mm inner diameter, the bite shank must have a diameter not more than 1 mm in order to form the oil reservoir. The shank having a diameter not more than 1 mm encounters abnormal vibrations due to the narrowed body when machining the sleeve, and is broken frequently. If the machining speed is slowed down to avoid this breakage, the machining time increases, which boosts the manufacturing cost. Narrowing of the inner diameter of the sleeve has thus been at a standstill from the machining view of point.

If oil reservoir 155 is traded off against narrowing the diameter of sleeve 106 to be not more than 2 mm, the quantity of oil 114 retained within the bearing decreases so that the lubricating quantity should be as little as not more than 0.0005 ml. Constant lubrication by such a small amount is hardly possible, and surplus oil would travel on shaft 109 as well as fan 108 and flow out. The flow-out oil would be scattered around the motor. Not only surplus oil, but also necessary oil, would follow the flow-out oil little by little, which lowers the reliability of the bearing.

Further, apparatuses and appliances which are equipped with more functions and have undergone the downsizing process are obliged to liberate a greater heating value. The cooling-fan-motor mounted in these apparatuses and appliances experiences significant temperature changes, and is forced to drive at a high rotational speed in order to promote cooling efficiency. When the motor works frequently in an environment where significant temperature changes occur, oil 114 within the bearing or air entrapped in the oil repeatedly expand and contracts. In the conventional bearing, oil 114 flows out from the opening end of sleeve 106 during expansion, and the bearing is short of oil 114 during contraction. As a result, the reliability of bearing is lowered.

SUMMARY OF THE INVENTION

The present invention addresses the problems discussed above, and aims to provide a motor free from oil-spill from its bearing during operation as well as having less oil-shortage for a smooth operation, and also provides a heat sink device using the same motor for achieving efficient cooling.

The motor of the present invention comprises the following elements:

(a) a frame having an opening;
(b) a housing formed on the frame and having one side thereof open;
(c) a stator secured on an outer wall of the housing;
(d) a sleeve fit into the housing and having an inner wall machined straight in its axial direction;
(e) a rotary shaft extending through the sleeve and being journaled by the sleeve;
(f) a ventilating path formed on at least one of inner wall of the housing or outer wall of the sleeve, and extending from an opening to a bottom of the housing;
(g) an annular recess for pooling oil formed on the outer wall of the sleeve and communicating with the ventilating path;

(h) a rotor having a magnet opposite to the stator; and (i) oil provided in the space between the shaft and sleeve, in the annular recess, and in a space between the bottom of housing and the sleeve.

The foregoing construction allows the oil to pool in the annular recess formed on the outer wall of sleeve. The inner wall of the sleeve can thus be machined straight in the axial direction. In other words, the grooves can be formed after the inner wall of sleeve is machined in straight direction. The narrowed bearing can be thus machined with ease.

Since the oil is pooled in the grooves of the sleeve and the annular recess, the oil can be supplied anytime to the space between the inner wall of sleeve and the outer wall of shaft even if the oil splashes or flows out from the grooves by centrifugal force. The oil supplied to this space has a surface tension greater than that of the oil pooled in the grooves of sleeve and in the annular recess, whereby the oil is prevented from spilling out from the bearing.

The heat sink device of the present invention comprises the following elements:

(a) a frame having an opening on a first face and being mounted with a heating element on a second face;

(b) a housing formed on a face with an opening of the frame and having an open end;

(c) a stator secured on an outer wall of the housing;

(d) a sleeve fit into the housing and having an inner wall thereof machined straight in its axial direction;

(e) a rotary shaft extending through the sleeve and being journaled by the sleeve;

(f) grooves producing dynamic pressure, formed on at least one of the inner wall of the sleeve and an outer wall of the rotary shaft;

(g) an annular recess formed on an outer wall of sleeve and facing an inner wall of the housing;

(h) a tapered section formed on a tip of the shaft facing the bottom of housing;

(i) a rotor having a magnet opposite to the stator; and (j) oil provided in the grooves producing dynamic pressure as well as in the annular recess, and provided in the space formed by the tapered section, the bottom face of the housing and the sleeve.

The construction discussed above allows the heat produced by a heating element secured on the frame to travel through the frame straightforwardly and dissipate from the frame surface. The rotor spins the fan to draw air from the frame opening, and produces airflow. The airflow hits the frame to dissipate the heat. An efficient heat sink device is thus realized.

DESCRIPTION OF THE PREFERRED EMBODIMENT

An exemplary embodiment of the present invention is described hereinafter with reference to FIGS. 1, 2 and 3.

Figure 1:
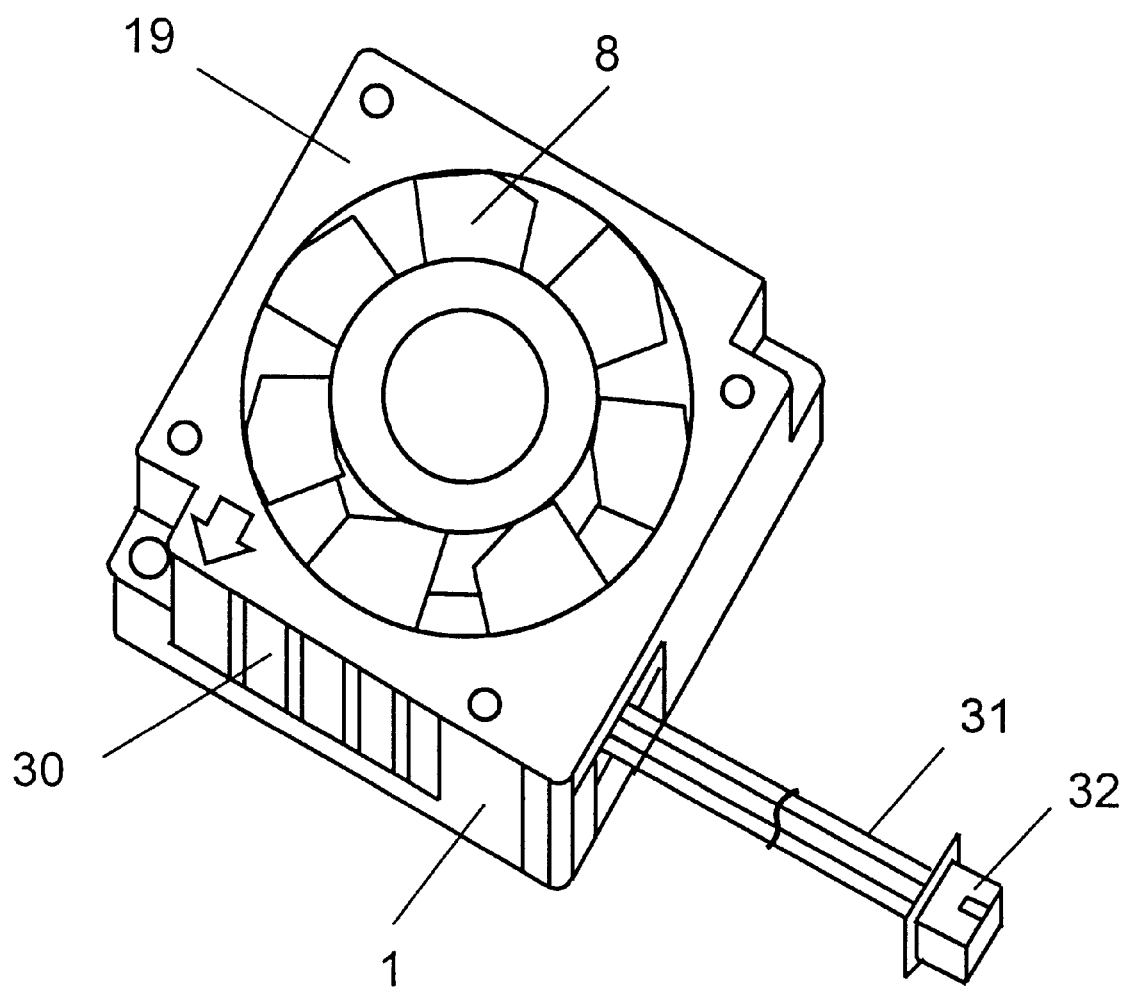
FIG. 1 is a perspective view of a heat sink device in accordance with an exemplary embodiment of the present invention.

FIG. 1 is a perspective view of a heat sink device in accordance with the exemplary embodiment of the present invention.

In FIG. 1, the heat sink device secures a semiconductor device, e.g. a CPU, underneath the bottom face of metal frame 1. The heat generated by the semiconductor device travels to the frame 1. The heat sink device draws air from the top opening by rotating fan 8, and discharges the air through openings 30 provided on a side wall of frame 1. Airflow produced by the draw and discharge operations travels on the inner face of frame 1 and goes out from openings 30 of the side wall so that the heat within frame 1 can be efficiently dissipated. Bell-mouth 19 mounted around the top opening promotes the airflow. A first terminal of lead-wire 31 is coupled to a driving-circuit-substrate disposed in frame 1 through a hole or a notch provided on the side wall of frame 1. A second terminal of lead-wire 31 is connected to connector 32 that is coupled to a power supply (not shown) and a controller (not shown). The power supply drives this heat sink device, and the controller exchanges control information between the controller and heat sink device.

Figure 2:
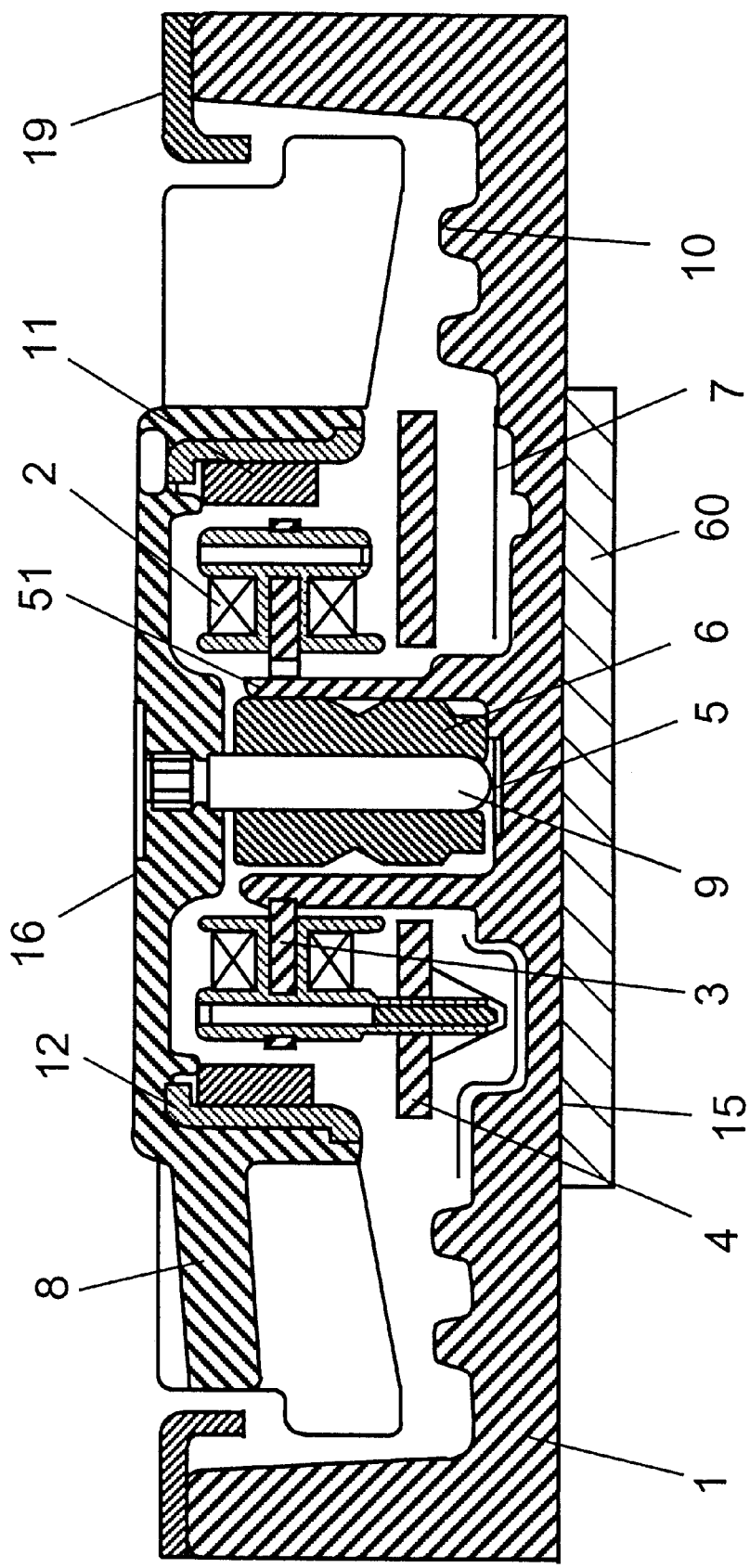
FIG. 2 is a cross section of the heat sink device in accordance with the exemplary embodiment of the present invention.

FIG. 2 is a cross section of the heat sink device in accordance with the exemplary embodiment of the present invention. FIG. 3 is a cross section depicting a bearing of a motor employed in the heat sink device in FIG. 2.

Housing 51 having one open side and shaped in a cup is protrusively formed in a recess of frame 1. Housing 51 secures stator 3 on its outer wall, and stator 3 is wound with coil 2. Driving-circuit-substrate 4 is disposed around housing 51. Substrate 4 holds stator 3 and connects electrically a terminal of coil 2 to a wiring formed on substrate 4 by soldering. Substrate 4 is equipped with electronic components constituting the driving circuit and Hall elements detecting a rotational position of rotor 16. Insulating sheet 7 is disposed between substrate 4 and frame 1. Fins 10, shaped as a plate, an arc or a pin, are disposed in the recess of frame 1.

Frame 1 is surrounded by a side wall and has an upward opening. Bell-mouth 19 is disposed around the opening to promote airflow. Frame 1 is equipped with a given number of openings (marked with numeral 30 in FIG. 1) having a given size on the side wall, and these openings run air through themselves in a given direction. The bottom face of frame 1 has a flat region, and heating elements 60, e.g. semiconductor devices, can be mounted underneath this flat region. Frame 1 and fins 10 are made of metal materials of high thermal conductivity, such as aluminum, brass and copper, so that thermal conductivity from the heating elements 60 to the frame and fins as well as the heat-dissipation-efficiency can be boosted.

The bottom of cup-shaped housing 51 is recessed so that a step is formed. Thruster 5 made of resin is disposed at the bottom of the recessed section. Sleeve 6 is inserted into housing 51 and fitted into the recessed section. Ventilating path 53 is formed between the inner wall of housing 51 and the outer wall of sleeve 6, and path 53 extends from top to bottom of the housing 51. The step formed in housing 51 can pool oil in the recessed section.

Stator unit 15 is structured as discussed above and comprises frame 1, housing 51, sleeve 6, coil 2 and stator 3.

Rotary shaft 9 measures 1.2 mm across—extending through sleeve 6—is supported axially by thruster 5, and is journaled by sleeve 6. Shaft 9 is provided with a unitary fan 8. Magnet 11 is bonded to fan 8 via magnet yoke 12 so that magnet 11 faces annular stator 3. Rotor 16 is structured as discussed above and comprises magnet 11, yoke 12 and fan 8.

The bearing of the motor is detailed hereinafter with reference to FIG. 3.

Figure 3:
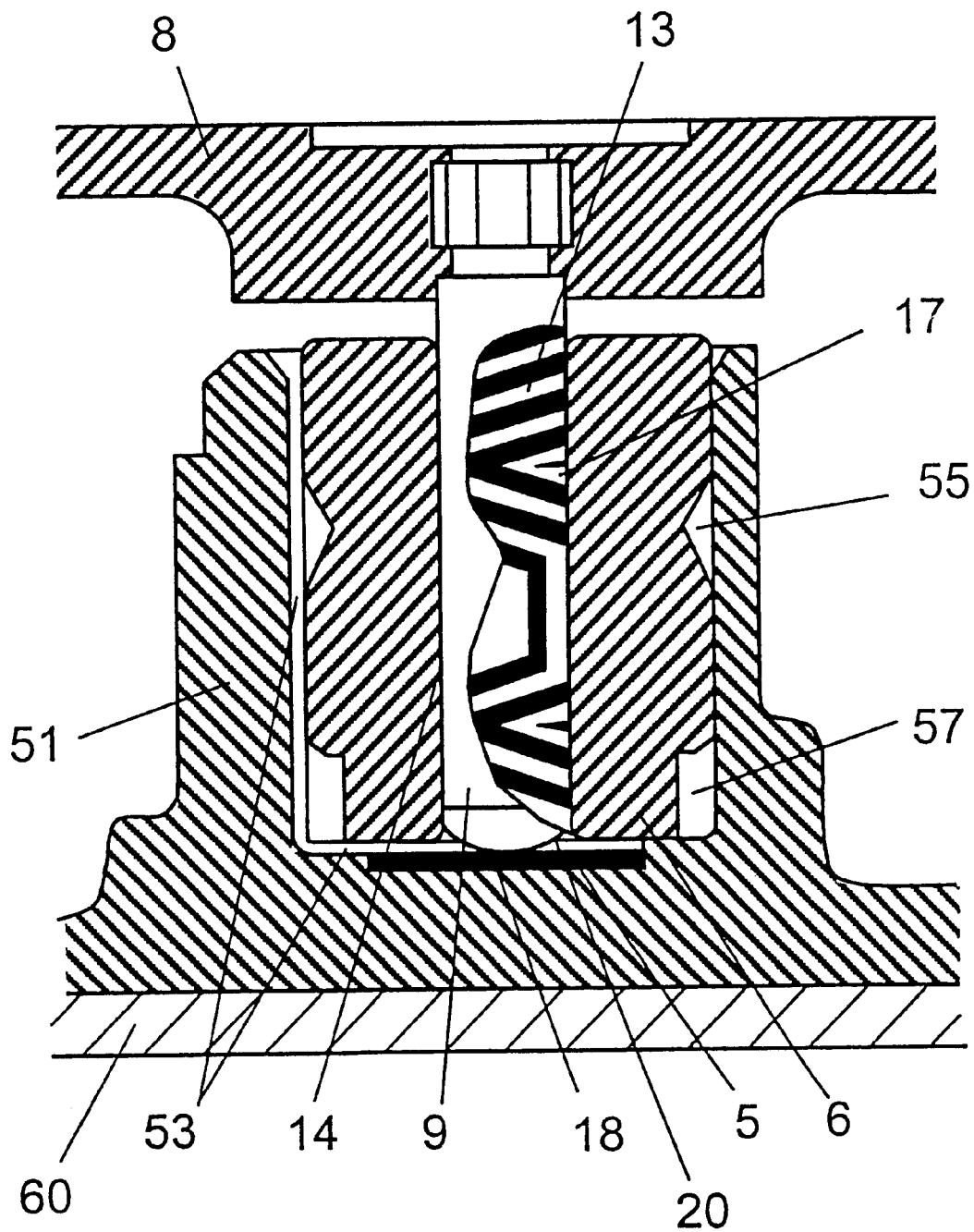
FIG. 3 is a cross section depicting a bearing of a motor employed in the heat sink device in accordance with the exemplary embodiment of the present invention.
Figure 4:
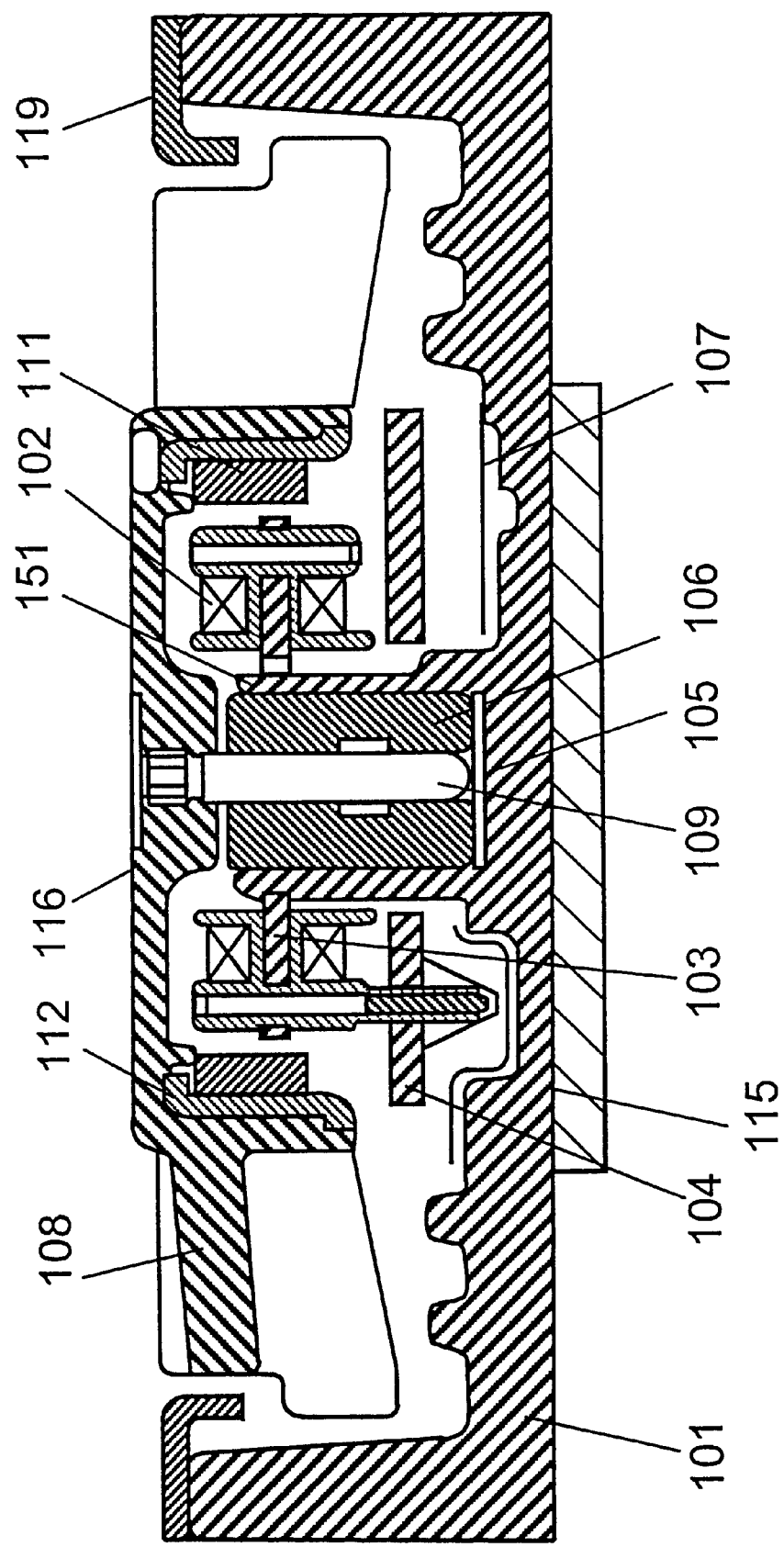
FIG. 4 is a cross section depicting a conventional heat sink device for semiconductor devices.

In FIG. 3, the inner wall of sleeve 6 is machined straight in its axial direction except for both edges of the wall, which are chamfered by 0.1 mm. The machined inner wall surface undergoes a ball-rolling process, whereby dynamic-pressure-generating grooves 13 are formed at two places on the inner wall surface. The grooves 13 form herring-bone-shape so that oil is retained therein. The rotation of shaft 9 moves the oil along grooves 13 to the center portions thereof, thereby producing a pumping force. Shaft 9 is thus centered at the sleeve and journaled by the sleeve.

Dynamic-pressure-generating-grooves 13 are more detailed hereinafter.

Grooves 13 undergo a sizing process for removing burrs, which are by-products of the ball-rolling-process, so that the inner wall surface is finished as flat as having not more than ±2 $\mu$m error. The clearance between shaft 9 and sleeve 6 is determined at 2–12 $\mu$m for each side. Oil 14 is provided to grooves 13 as a lubricant for shaft 9 and sleeve 6. Radial bearing 17 is structured as discussed above, and sleeve 6 journals shaft 9. Grooves 13 can be formed on the outer wall of shaft 9 instead of on the inner wall of sleeve 6.

Annular recess 55 facing the inner wall of housing 51 is formed on sleeve 6. In this exemplary embodiment, annular recess 55 is formed on the outer wall of sleeve 6 and at around its center in the axial direction. Annular recess 55 has a depth of ca 0.1 mm, and both the ends thereof lead to the outer wall of sleeve 6 at an angle of 5–45° with regard to the axial direction. Annular recess 55 accepts surplus oil 14 that is supposed to be retained by grooves 13.

On the end of sleeve facing the bottom face of housing 51, a step-back section 57 is formed. Step-back section 57 begins by flaring sleeve 6 (outwardly tapering) forming an angle of 5–45° with regard to the axial direction. The space formed by step-back section 57 and housing 51 retains surplus oil 14 that is supposed to be retained by grooves 13.

Further, the end of shaft 9 forms section 20 tapered to the bottom face of housing 51. This tapered section 20 is machined to form an angle of 5–30° with regard to the axial direction.

The tip of shaft 9 is machined to be spherical and contacts thruster 5 so that thruster 5 supports shaft 9 in the axial direction, whereby thrust bearing 18 is constructed.

A space formed by tapered section 20, the bottom face of housing 51 and sleeve 6 is lubricated with the same oil as retained in grooves 13; however, the space receives a greater amount of the oil than that in grooves 13.

Sleeve 6 is made of copper alloy specified by JIS C3604 or JIS BC6C (JIS=Japanese Industrial Standard) because the efficiencies of cutting and ball-rolling are considered. Shaft 9 is made of stainless steel specified by JIS SUS420J2 or the like because abrasion-resistance and easy-treatment are considered. Oil 14 is a heatproof oil such as a fluorine synthetic fluid to withstand a high temperature, for the heat sink device of the present invention often secures semiconductor devices (heating elements) directly to the frame and is thus required to resist a high temperature. Extreme-pressure-additive is added to oil 14 so that a locally concentrated extreme pressure can be moderated.

Figure 5:
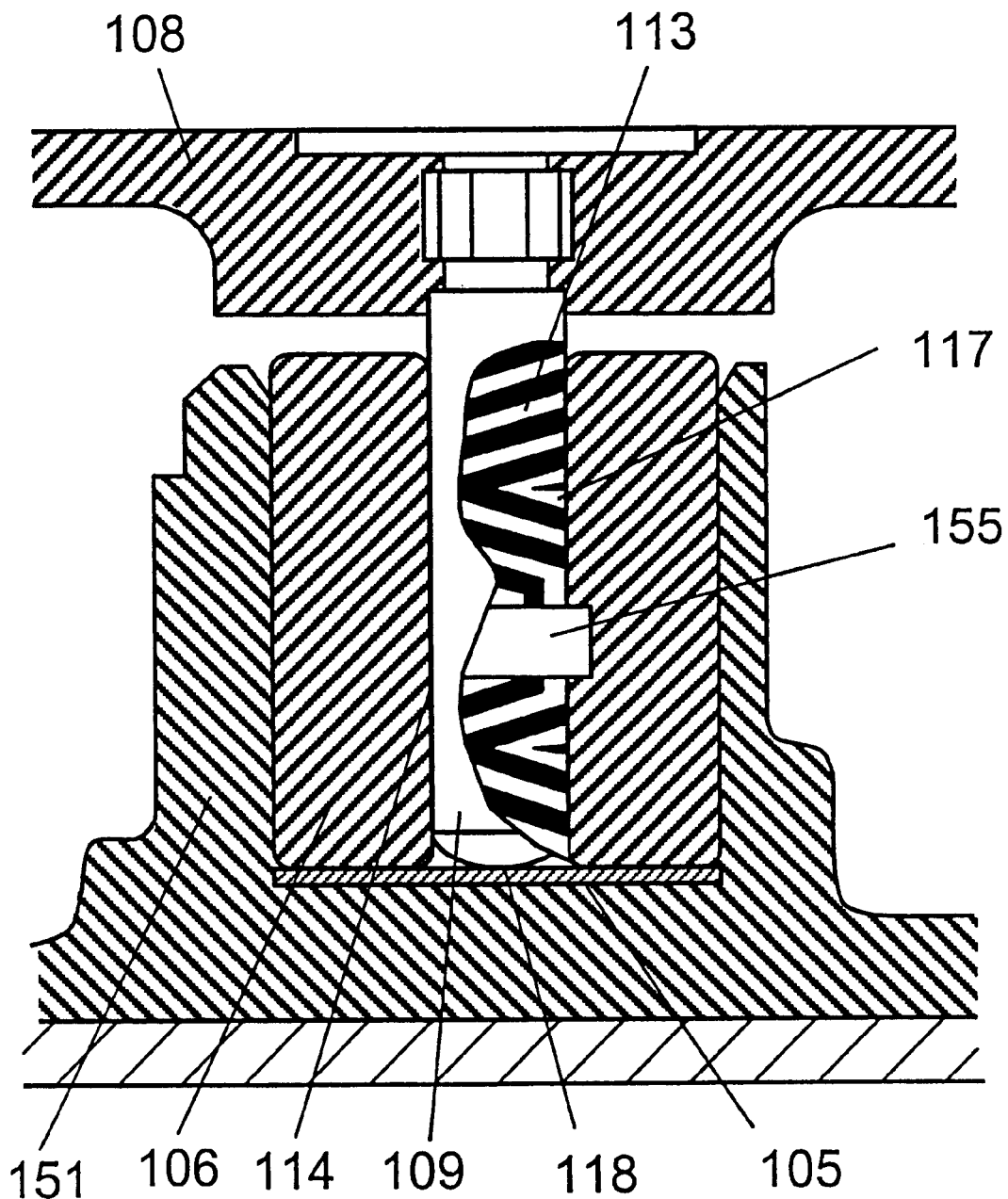
FIG. 5 is a cross section of a bearing of a motor employed in the heat sink device depicted in FIG. 4.

The construction discussed above allows oil 14 to travel through ventilating path 53 and pool in annular recess 55, step-back section 57, and tapered section 20 formed at the end of shaft 9. Therefore, the inner wall of sleeve 6 can just be machined straight in the axial direction, although the prior art shown in FIG. 5 requires forming oil reservoir 155 on sleeve 106, which requires an elaborate process. Therefore, the bearing with sleeve 6, when inner diameter measures not more than 2 mm, can be machined with ease, thereby restraining the manufacturing cost. After the machining, the inner wall surface of sleeve 6 is provided with dynamic-pressure-generating grooves 13 by ball-rolling. Shaft 9 extends—with the diameter measuring not more than 2 mm, i.e. 1.2 mm—through sleeve 6.

The three oil reservoirs, i.e. annular recess 55, step-back section 57 and tapered section 20, can absorb volume variations of the oil due to expansion or contraction of the oil per se and the air entrapped in the oil when the temperature changes.

Oil 14 lubricated in the bottom of housing 51 travels into a space between tapered section 20 and the inner wall of sleeve 6, and further rises at a greater surface tension because of a larger diameter of shaft 9. This phenomenon contributes to supplying oil anytime to grooves 13 even if they would be short of oil due to oil splash by centrifugal force produced by the spin of shaft 9, or due to oil-spill exceeding the absorptive capacity because of oil-volume-variation. Oil shortage in grooves 13 can thus be eliminated.

Ventilating path 53 is formed at the fit portion between housing 51 and sleeve 6. When shaft 9 is inserted into sleeve 6, air within sleeve 6 escapes so that air-pressure of the air between the bottom of housing 51 and sleeve 6, and that of the air on the fan side above sleeve 6, become equal. As a result, shaft 9 can be inserted smoothly into sleeve 6.

The space between housing 51 and sleeve 6, i.e. the depth of path 53, is set so narrow that oil does not flow out through path 53 even if the heat sink device is placed upside down, namely, fan 8 is placed at the bottom. In this exemplary embodiment, the space is set at not more than 0.3 mm, thereby preventing the oil from flowing out by surface tension. Path 53 can be formed on at least one of the outer wall of sleeve 6, or the inner wall of the housing 51.

If an annular recess were provided around the outer wall of the shaft 9 in the neighborhood between the upper end of sleeve 6 and fan 8, as a measure for absorbing the volume variation in oil 14, a large amount of oil would pool in this reservoir. The oil in the reservoir then is contacted by fan 8 placed immediately adjacent to the reservoir, and the oil is vulnerable to splashing due to centrifugal force. An oil path leading to fan 8 is formed so that the oil can travel with ease, which results in an oil shortage at an earlier time. On the other hand, the present invention provides three oil reservoirs at separate places, i.e. annular recess 55 and step-back section 57 on sleeve 6, and tapered section 20 on the tip of shaft 9. Therefore, fan 8 never touches the oil so that no oil shortage due to splashing is expected.

Figure 6A:
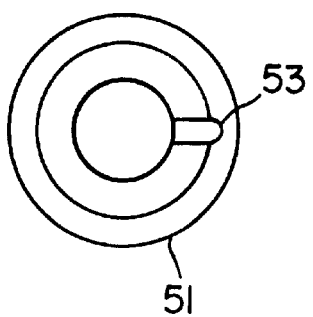
FIGS. 6a–6e illustrates details and variations of a ventilating path and dynamic pressure generating grooves according to the exemplary embodiment of the present invention.

FIG. 6*a* illustrates a top view of the ventilating path 53 in the housing 51.

Figure 6B:
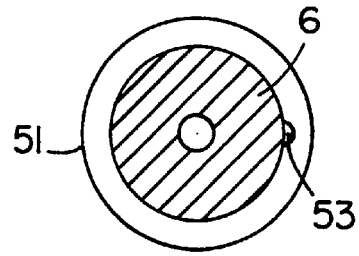

FIG. 6*b* illustrates a similar top view with the sleeve 6 inserted in the housing 51.

Figure 6C:
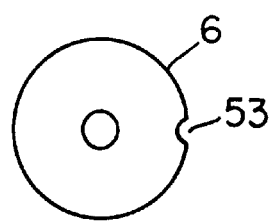
Figure 6D:
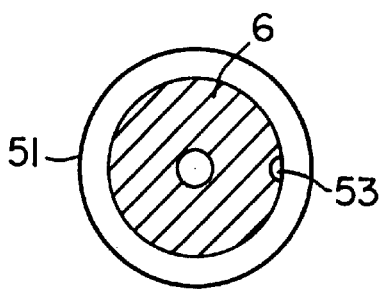

FIG. 6*c* illustrates the ventilating path 53 formed on the sleeve 6 itself, with FIG. 6*d* corresponding to FIG. 6*b*.

Figure 6E:
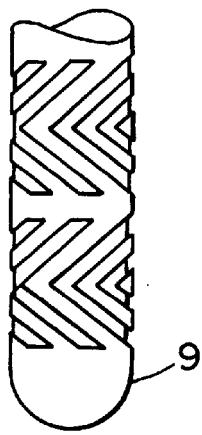

FIG. 6*e* illustrates dynamic pressure generating grooves on the shaft 9.

Operation of the heat sink device of the present invention is described hereinafter.

The heat sink device draws air in the axial direction of shaft 9 from the top opening of frame 1 when the motor spins fan 8. The air travels through a path formed by fins 10 and is discharged from openings 30 provided on the side wall of frame 1. The airflow conducts heat from frame 1 and fins 10 to which the heat travels from heating elements, so that the heat sink device functions well. The directions of openings 30 on the side wall are adaptively determined responsive to the applications intended by an apparatus employing this heat sink device, such as blowing the discharged air to other heating elements or discharging the heated air from the apparatus efficiently.

The shape of fins 10 is not limited to a plate, an arc or a pin, but may be a triangle, wing, coil, circle, or a radial shape, as long as the fins work in the same way and produce the same effect. When an outer dimension of the heat sink device measures as little as less than 40 mm square, the motor is naturally downsized, which results in a smaller output of the motor. In this case, wind force produced by the fan becomes poor, and fins disposed in the frame block the airflow and thus reduce air capacity to be discharged. The fins therefore produce an adverse effect. In the case of employing such a small heat sink device, fins are desirably omitted so that the air capacity to be discharged can be increased to boost the heat dissipation effect.

The structures of the heat sink device, the motor, and the bearing, as well as the kind of oil, are not limited to this exemplary embodiment, and various modifications are available.

As discussed above, the present invention realizes a long-life motor in which the bearing can be machined with ease, can be narrowed, and its oil-spill is prevented. The present invention also provides a small-sized heat sink device employing this motor. The heat sink device thus operates efficiently with less noise.

What is claimed is:

1. A motor comprising:
   a frame;
   a housing disposed in said frame, said housing being tubular and having an outer wall, an inner wall, an opening and a bottom face;
   a stator secured to said outer wall of said housing;
   a sleeve in said housing, said sleeve having an inner wall that has been machined so as to be straight in an axial direction of said sleeve, and said sleeve being disposed in said housing so that a space is formed between said bottom face of said housing and said sleeve;
   a rotary shaft extending through said sleeve and being rotatably supported by said sleeve, said shaft and said sleeve having a space there between;
   a ventilating path formed on at least one of said inner wall of said housing and said outer wall of said sleeve, said ventilating path extending from said opening of said housing to said bottom face of said housing;
   a recess formed on said outer wall of said sleeve, said recess communicating with said ventilating path;
   a rotor having a magnet opposite to said stator; and
   oil provided in said space between said shaft and said sleeve, in said recess, and in said space formed between said bottom face of said housing and said sleeve.

2. The motor of claim 1, wherein said recess is an annular groove formed on said outer wall of said sleeve.

3. The motor of claim 1, wherein said sleeve has no inner diameter more than 2 mm.

4. The motor of claim 2, wherein said sleeve has no inner diameter more than 2 mm.

5. The motor of claim 1, wherein a dynamic pressure generating groove is formed on one of said outer wall of said shaft and said inner wall of said sleeve, said groove retaining oil therein.

6. The motor of claim 2, wherein a dynamic pressure generating groove is formed on one of said outer wall of said shaft and said inner wall of said sleeve, said groove retaining oil therein.

7. The motor of claim 1, wherein said ventilating path is defined by and between said inner wall of said housing and said outer wall of said sleeve.

8. The motor of claim 1, wherein said recess directly faces said inner wall of said housing.

9. The motor of claim 1, wherein said inner wall of said sleeve is continuously straight between an upper terminal end and a lower terminal end thereof, having no more than a dynamic pressure generating groove formed thereon.

10. The motor of claim 1, wherein said ventilating path is defined between said sleeve and said housing and extends from said bottom face of said housing to an opening formed between a terminal end of said housing and a terminal end of said sleeve.

11. A motor comprising:
   a frame;
   a housing disposed in said frame, said housing being tubular and having an outer wall, an inner wall, an opening and a bottom face;
   a stator secured to said outer wall of said housing;
   a sleeve in said housing, said sleeve having an inner wall that has been machined so as to be straight in an axial direction of said sleeve, and said sleeve being disposed in said housing so that a space is formed between said bottom face of said housing and said sleeve;
   a rotary shaft extending through said sleeve and being rotatably supported by said sleeve, said shaft and said sleeve having a space there between;
   a dynamic pressure generating groove formed on part of said outer wall of said rotary shaft, said dynamic pressure generating groove facing said inner wall of said sleeve so as to generate dynamic pressure upon relative rotation between said rotary shaft and said sleeve;
   a ventilating path formed on at least one of said inner wall of said housing and said outer wall of said sleeve, said ventilating path extending from said opening of said housing to said bottom face of said housing;
   a recess formed on said outer wall of said sleeve, said recess communicating with said ventilating path;
   a rotor having a magnet opposite to said stator; and
   oil provided in said space between said shaft and said sleeve, in said dynamic pressure generating groove, in said recess, and in said space formed between said bottom face of said housing and said sleeve.

12. The motor of claim 11, wherein said ventilating path is defined by and between said inner wall of said housing and said outer wall of said sleeve.

13. The motor of claim 11, wherein said recess directly faces said inner wall of said housing.

14. The motor of claim 11, wherein said inner wall of said sleeve is continuously straight between an upper terminal end and a lower terminal end thereof.

15. The motor of claim 11, wherein said ventilating path is defined between said sleeve and said housing and extends from said bottom face of said housing to an opening formed between a terminal end of said housing and a terminal end of said sleeve.

16. A motor comprising:

a frame;

a housing disposed in said frame, said housing being tubular and having an outer wall, an inner wall, an opening and a bottom face;

a stator secured to said outer wall of said housing;

a sleeve in said housing, said sleeve having an inner wall that has been machined so as to be straight in an axial direction of said sleeve, and said sleeve being disposed in said housing so that a space is formed between said bottom face of said housing and said sleeve;

a rotary shaft extending through said sleeve and being rotatably supported by said sleeve, said shaft and said sleeve having a space there between;

a dynamic pressure generating groove formed on one of said outer wall of said rotary shaft and said inner wall of said sleeve so as to generate dynamic pressure upon relative rotation between said rotary shaft and said sleeve;

a recess formed on said outer wall of said sleeve, said recess facing said inner wall of said housing;

a tapered section formed on an end of said shaft facing said bottom face of said housing;

a rotor having a magnet opposite to said stator; and oil provided in said space between said shaft and said sleeve, in said dynamic pressure generating groove, in said recess, at said tapered section and in said space formed between said bottom face of said housing and said sleeve.

17. The motor of claim 16, wherein said recess directly faces said inner wall of said housing.

18. The motor of claim 16, wherein said inner wall of said sleeve is continuously straight between an upper terminal end and a lower terminal end thereof, having no more than said dynamic pressure generating groove formed thereon.

19. A heat sink device, comprising:

a frame having a first face, a second face, an opening on said first face, and a heat generating body mounted on said second face;

a housing formed on said first face of said frame, said housing being tubular and having an outer wall, an inner wall, an opening and a bottom face;

a stator mounted to said outer wall of said housing;

a sleeve in said housing, said sleeve having an inner wall that has been machined so as to be straight in an axial direction of said sleeve, and said sleeve being disposed in said housing so that a space is formed between said bottom face of said housing and said sleeve;

a rotary shaft extending through said sleeve and being rotatably supported by said sleeve, said shaft and said sleeve having a space there between;

a dynamic pressure generating groove formed on one of said outer wall of said rotary shaft and said inner wall of said sleeve so as to generate dynamic pressure upon relative rotation between said rotary shaft and said sleeve;

a recess formed on said outer wall of said sleeve, said recess facing said inner wall of said housing;

a tapered section formed on an end of said shaft facing said bottom face of said housing;

a rotor having a magnet opposite to said stator; and oil provided in said space between said shaft and said sleeve, in said dynamic pressure generating groove, in said recess, at said tapered section and in said space formed between said bottom face of said housing and said sleeve.

20. The heat sink device of claim 19, and further comprising a fin disposed on said first face of said frame.

21. The heat sink device of claim 19, wherein said frame includes a side wall surrounding said housing, said side wall having at least one opening.

22. The heat sink of claim 19, wherein said recess directly faces said inner wall of said housing.

23. The heat sink of claim 19, wherein said inner wall of said sleeve is continuously straight between an upper terminal end and a lower terminal end thereof, having no more than said dynamic pressure generating groove formed thereon.

* * * * *